United States Patent [19]

Smayling et al.

[11] Patent Number: 4,804,637
[45] Date of Patent: Feb. 14, 1989

[54] EEPROM MEMORY CELL AND DRIVING CIRCUITRY

[75] Inventors: Michael C. Smayling, Missouri City; Sebastiano D'Arrigo, Houston, both of Tex.

[73] Assignee: Texas Instruments Incorporated, Dallas, Tex.

[21] Appl. No.: 64,416

[22] Filed: Jun. 18, 1987

Related U.S. Application Data

[62] Division of Ser. No. 780,851, Sep. 27, 1985, abandoned.

[51] Int. Cl.$^4$ .................... H01L 21/265; H01L 21/70
[52] U.S. Cl. ........................................ 437/52; 437/44; 437/43; 357/23.5; 365/185
[58] Field of Search .............. 437/52, 49, 29, 30, 437/43, 44, 41; 357/23.5, 23.9, 54, 59; 365/185

[56] References Cited

U.S. PATENT DOCUMENTS

| | | | |
|---|---|---|---|
| 4,004,159 | 1/1977 | Rai et al. | 357/23.5 |
| 4,203,158 | 5/1980 | Frohman-Bentchkowsky et al. | 357/23.5 |
| 4,566,175 | 1/1986 | Smayling et al. | 437/43 |
| 4,573,144 | 2/1986 | Countryman, Jr. | 357/23.5 |
| 4,590,665 | 5/1986 | Owens et al. | 437/43 |

Primary Examiner—Brian E. Hearn
Assistant Examiner—M. Wilczewski
Attorney, Agent, or Firm—Theodore D. Lindgren; Rodney M. Anderson

[57] ABSTRACT

An electrically erasable programmable memory device which includes a floating gate, heavily doped source and drain regions in which one side thereof is laterally spaced from the floating gate, and the other side has a lightly doped "reach-through" region between the heavily doped region and the channel that underlies the floating gate. A control gate overlies the floating gate. The oxide thickness between the gate and channel is sufficiently thin such that electron tunnleing takes place between the floating gate and the "reach through" region.

10 Claims, 5 Drawing Sheets

EEPROM MEMORY CELL AND DRIVING CIRCUITRY

This is a divisional of application Ser. No. 780,851, filed Sept. 27, 1985, now abandoned.

FIELD

The present invention relates to an erasable electrically programmable memory cell (EEPROM) and its related driving circuitry.

BACKGROUND OF THE INVENTION

Conventional EEPROM's employ 3 to 4 transistors. These include a tunnel diode device copuled to the floating gate of the sense transistor to charge the latter and a select or row transistor to activate the cell. The use of 3 or 4 transistors in a cell clearly limits the size reduction possible for EEPROM arrays. Moreover, since normal operation involves the application of voltages in excess of 15 volts current cells need special processing to reduce leakage and larger layout to avoid unwanted field transistor turn on. A high voltage applied to moats which constitute the sources and drains of the field effect transistors is a particularly serious problem due to the diffused nature of their formation. High voltages on such junctions lead to DC leakage currents, a need for greater moat-to-moat isolation spacing, and to bulk punchthrough. The row transistor is particularly vulnerable to the latter effects since high voltage is applied to its source during the ERASE mode.

High voltage requirements also obviously require high voltage transistors or level shifters in the column circuitry which are susceptible to a relatively high likelihood of failure. Finally, the presence of high voltages can result in unintended programming or reading of memory cells.

One solution to avoid such problems would be to lower the programming voltage by using thinner tunnel oxide of the order of 70 Angstroms thick. However, this solution would increase leakage thereby decreasing data retention. Coupling efficiency could also be increased but at the expense of area.

It is therefore a principal object of this invention to provide an improved erasable electronically programmable memory cell. Another object is to provide a floating gate EEPROM which operates with lower voltages than current such devices. A further object is to provide an EEPROM cell which occupies a smaller area than current EEPROM devices.

SUMMARY OF THE INVENTION

In accordance with the invention there is provided an electrically erasable programmable memory device which includes a floating gate and heavily doped source and drain regions in which one side thereof is laterally spaced from the floating gate, and the other side has a lightly doped reach-through region between the heavily doped region and the channel that underlies the floating gate. A control gate overlies the floating gate. The oxide thickness between the gate and channel is sufficiently thin such that electron tunneling takes place between the floating gate and the "reach through" region.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
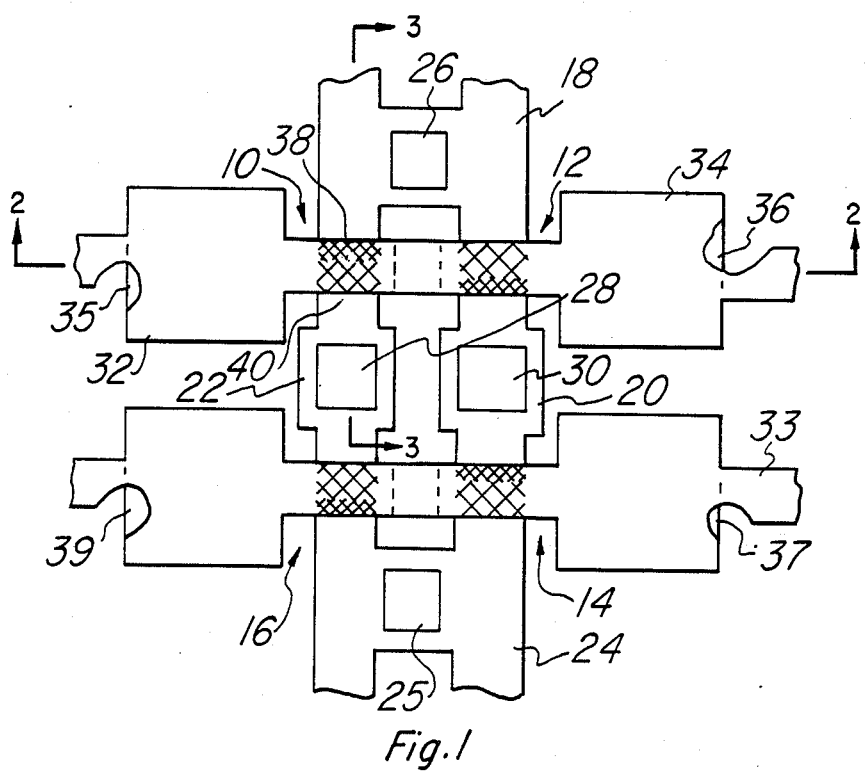
FIG. 1 is a greatly enlarged plan view of four of the memory cells in an array.

Referring to FIG. 1, there is shown an array of 4 memory cells 10, 12, 14 and 16 of the floating gate type without metal layers. Cells 10 and 12 share a common N+ type source moat 18 and cells 14 and 16 share a common N+ type source moat 24. Cells 10 and 16 share a common N+ type drain 22 and cells 12 and 14 share a common N+ type drain 20. Contacts to moats 18, 20, 22 and 24 connect to contact areas 26, 30, 28 and 25, respectively. Polysilicon layers 35, 36, 37, and 39 form floating gates for transistors 10, 12, 14 and 16, respectively, while polysilicon layers 34 and 33 form control gates overlying floating gates 35, 36 and 37, 39, respectively, and correspond to the row lines.

Considering transistor 10 as a representative example, the source 18 to drain 22 path area has an area 38 used as a floating sense gate and a portion 40 used for electron tunneling.

Figure 2:
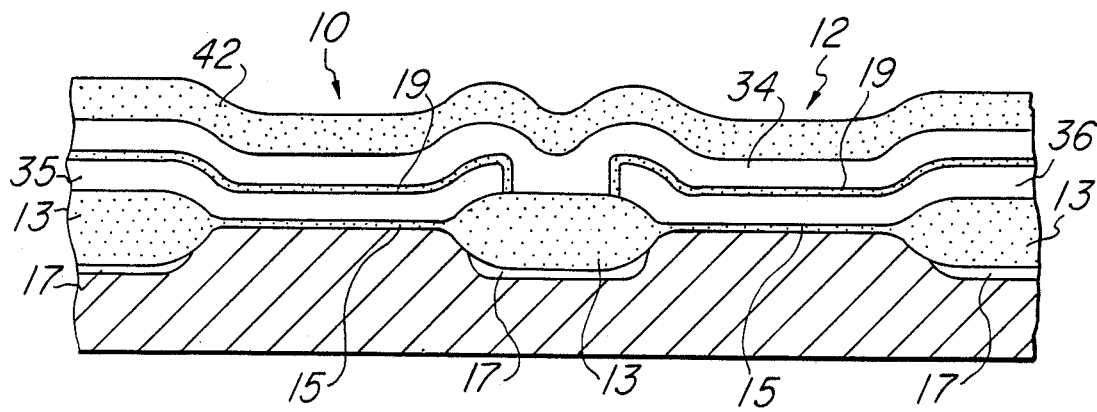
FIG. 2 and 3 are elevation views in section of the device of FIG. 1 taken along lines 2—2 and 3—3, respectively.

The structure along line 2—2 of FIG. 1 shown in FIG. 2 includes a thin oxide layer 15 of about 100 Angstroms thick under polysilicon floating gates 35 and 36 and layers 19 of interlevel oxide of about 375 A thickness. A second level of polysilicon 34 forming a row line is deposited and patterned as seen is FIG. 1 over interlevel oxide 19 and in alignment with floating gates 35 and 36. The overlap of each floating gate 35 and 36 with the second level of polysilicon 34 extends beyond merely the source to drain path between source 18 and drains 20 and 22 in order to provide a requisite capacitive coupling between the control gate 34 and the floating gate 35. A layer of silicon oxide 42 covers the second level polysilicon 34. Metal contact coupling is made to source 18 on contact area 26 while that to drains 20 and 22 are made on contact areas 30 and 28, respectively, the latter forming bit lines.

Figure 3:
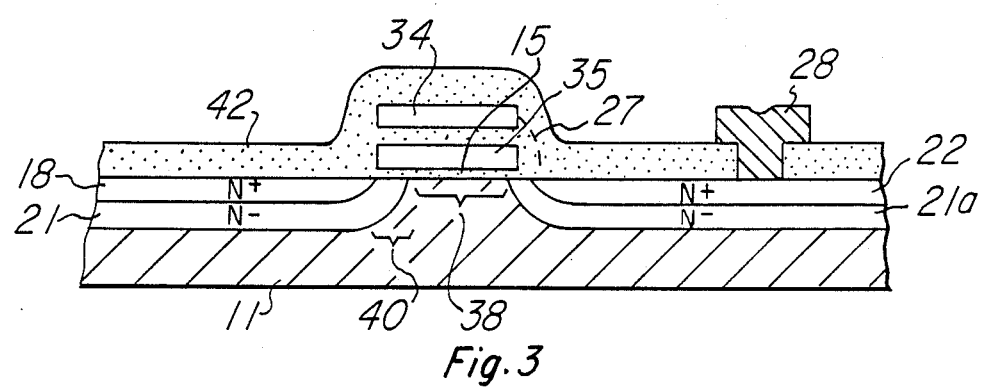

As shown in FIG. 3 taken along line 3—3 of FIG. 1 the substrate 11 has implanted and diffused therein not only N+ type source and drain regions 18 and 22 but also an N− type 'reach through' layer 21 which emerges at the surface of substrate 11 along one side of floating gate 35 corresponding to area portion 40 of FIG. 1. A second reach-through layer 21a emerges at the surface of substrate 11 along the other side of floating gate 35 beneath the sidewall spacer 27. The width of portion 40 which is a lightly doped N− region is approximately 0.4 micrometers. Typically, the area occupied by portion 40 is 0.375 square micrometers and that of sense gate 38 is approximately 1.875 square micrometers. The area of the floating gate 35 is approximately 22 square micrometers, with 19.8 square micrometers over the field oxide 13. The coupling efficiency for a 100 A tunnel oxide layer, a 7000 A field oxide layer 13 and a 375 A interlevel oxide layer is about 70%. Using 1.5 micrometer square contacts with ½ micrometer registration each cell is approximately 6.0 micrometers long in the row direction and 8.2 microns in the column direction being substantially smaller than either a 3 or 4 transistor EEPROM.

Figure 4:
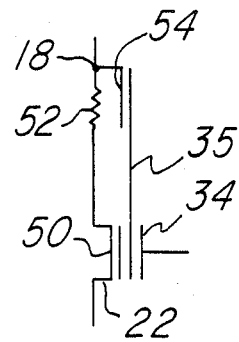
FIG. 4 is an equivalent circuit for a cell of FIG. 1.

The equivalent circuit for the structure of FIG. 3 is shown in FIG. 4 which consists of a drain 22, a floating gate 35, a control gate 34, body resistance 52 of reach-through region 40 and channel path 50 corresponding to channel region 38 of FIG. 3. With drain 22 floating, source 18 at ground potential and a high voltage (14 volts) Vpp applied to the control gate 34 tunneling of electrons across oxide layer 15 will take place in reach-through channel path region 40 charging the floating gate negatively. The latter corresponds to a WRITE mode. In the ERASE mode drain 22 again floats, source 18 is at about +7 volts and −7 volts is applied to control gate 34 thereby causing electrons to tunnel from floating gate 35 to "reach-through" region 40 and charge the floating gate 35 positively.

In the READ mode the source 18 is precharged to a precharge voltage which is about 5 volts, +2 volts is applied to the row line or control gate 34 if it is to be selected and −2 volts if it is not to be selected. With a negatively charged floating gate 34 no current flows and the precharge voltage remains constant while if the floating gate 35 has been positively charged then current flows from source 18 to drain 22 and the precharge voltage falls.

Utilizing bipolar voltages ensures that the voltage of the moats in an array of such cells never exceeds 7 volts thereby avoiding vulnerability to field breakdown problems in the diffusion formed source and drain junctions. A high voltage on the control gate 34 is not problematic because of the field plate isolation provided by the floating gate 35.

Figure 5:
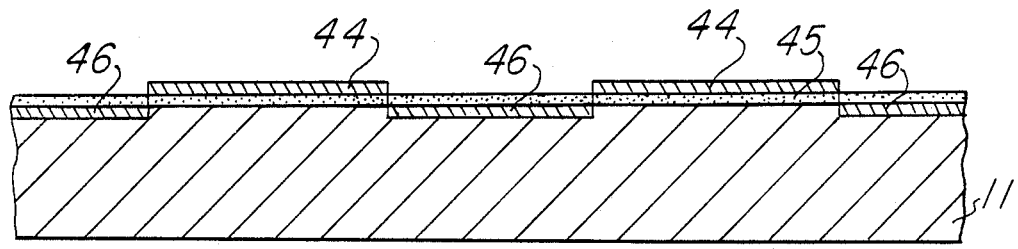
FIGS. 5 to 8 are elevation views in section along line 2—2 of FIG. 1 showing stages in the fabrication of the device.

The process for manufacturing the cells as shown in FIGS. 5–12, involves first selecting a slice of P-type monocrystalline silicon typically 4 inches in diameter, cut on the [100]plane of a resistivity of about 10 ohm-cm, or, alternately, P− epi on a P+ substrate. In the Figures the portion shown of the substrate 11 represents only a very small part of one bar or chip, which in turn is a small part of the slice. One slice contains several hundred bars. After cleaning, the slice is oxidized by exposing it to pyrogenic steam in a furnace at an elevated temperature of 900° C. to produce an oxide layer 45 of a thickness as of about 350 A over the entire slice. Next a layer 44 of silicon nitride of about 1300 A thickness is formed over the entire slice by exposing it to an atmosphere of dichlorosilane and ammonia in a reactor. A coating of photoresist (not shown) is applied to the entire top surface of the slice, then exposed to ultraviolet light through a mask which defines the desired pattern of the thick field oxide 13 and the P+ channel stops 17. The resist is developed, leaving areas where nitride is then removed by etching the exposed part of the nitride layer 44 but leaving in place the oxide layer 45 as seen in FIG. 5.

Using photoresist and nitride as a mask, the slice is subjected to a boron implant to produce the channel stop regions in unmasked regions 46 of the silicon. The regions 46 will not exist in the same form in the finished device, because silicon is consumed in the field oxidation procedure. Usually the slice is subjected to a heat treatment after implant, prior to field oxide growth, as set forth in U.S. Pat. No. 4,055,444, issued to G. R. Mohan Rao, and assigned to Texas Instruments Incorporated.

Figure 6:
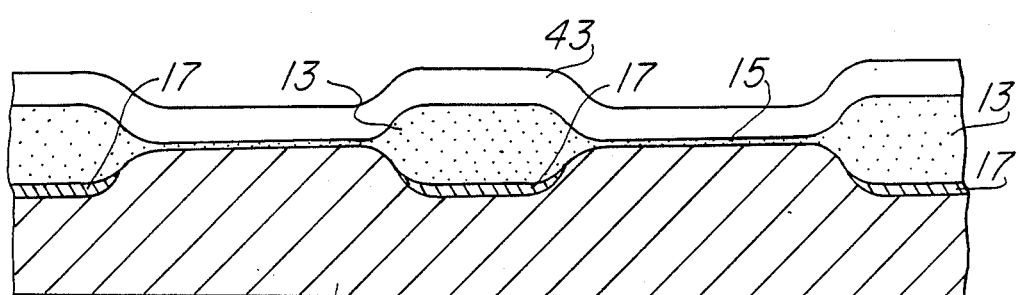

Next field oxide regions 13 are developed by subjecting the slice to steam or an oxidizing atmosphere at about 900° C. or above for perhaps 10 hours or more. This results in thick oxide layers 13 to be grown as seen in FIG. 6 extending into the silicon surface as silicon is consumed with the remaining part of the nitride layer 44 masking oxidation. The thickness of layers 13 is about 7000 A part of which part is above the original surface and part below. The boron doped P+ regions 46 formed by implant are partly consumed, but also diffuse further into the silicon ahead of the oxidation front to produce P+ field stop regions 17 which are much deeper than the original regions 46. Next the remaining nitride layer 44 is removed by etchant which attacks nitride but not silicon oxide, then oxide 45 is removed by etching and the exposed silicon cleaned. The oxide layer 15 is grown by thermal oxidation to a thickness of about 100 A.

Figure 7:
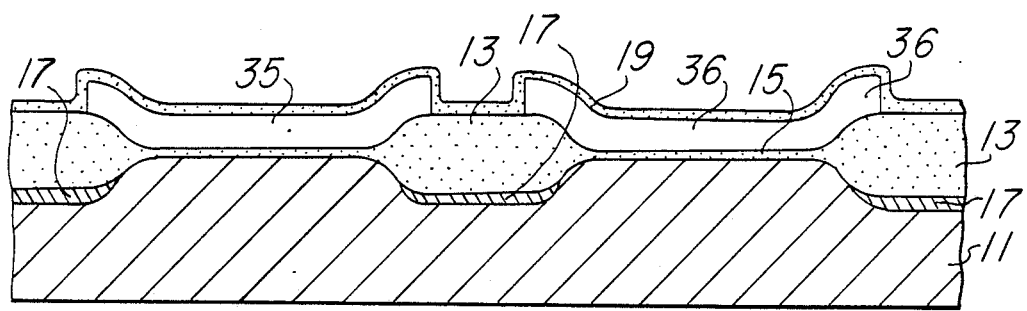

As shown in FIG. 6, a layer 43 of polycrystalline silicon and/or molybdenum silicide is deposited over the entire slice in a reactor using standard techniques to a thickness of about 5000 A. The latter layer is patterned as shown in FIG. 7 by applying a layer of photoresist, exposing the layer of photoresist to ultraviolet light through a mask prepared for this purpose, developing, then etching the exposed polysilicon to separate the polysilicon layer 43 into strips parallel to field oxide regions 13 define the gate 35. A layer of interlevel oxide 19 is formed over the face of the slice to a thickness of about 375 A.

Figure 8:
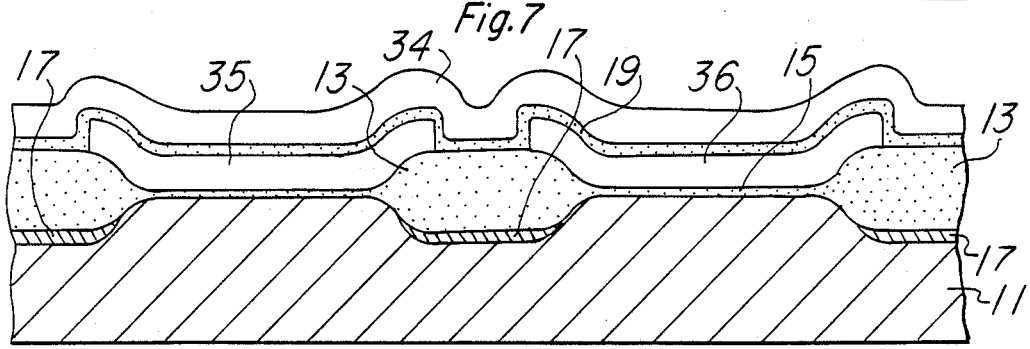
Figure 9:
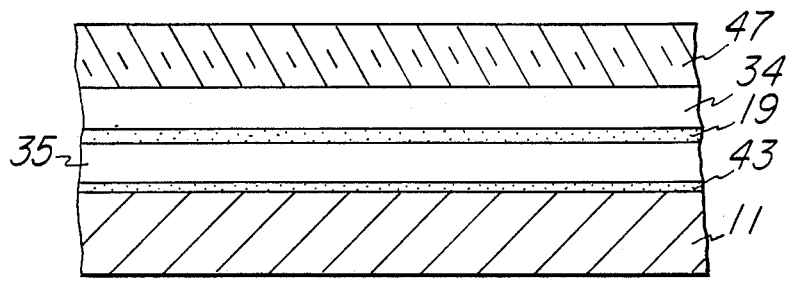
FIGS. 9–12 are elevation views in section taken along the line 3—3 of FIG. 1 showing various stages in the fabrication of the device.

Referring to FIG. 8, next a second level polysilicon 34 is deposited over the entire top surface of the slice using a reaction as above to provide the control gate for each cell including control gate 34 of cell 12. As seen in FIG. 9, the second level of polysilicon is patterned using photoresist 47 to define the shape of the floating and control gates 35 and 34, respectively, stripped and then etched.

Figure 10:
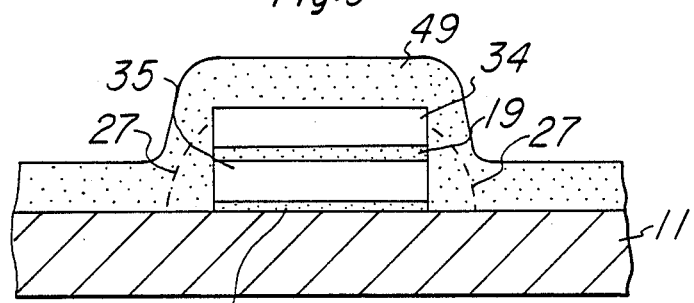
Figure 11:
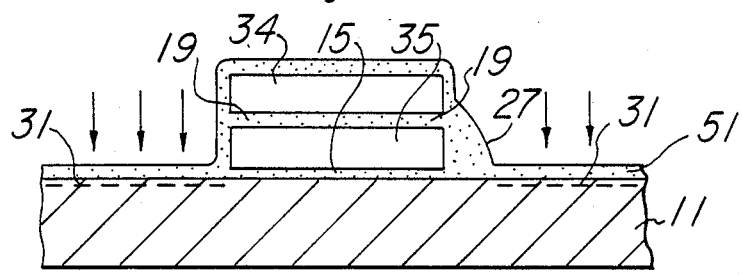

A thick layer of silicon oxide 49 is deposited over the entire slice by decomposition of silane at a low temperature, about 400° C. as shown in FIG. 10. The layer 49 is subjected to directional or anisotropic etch using reactive ion etching or a plasma etch as in U.S. Pat. No. 4,297,162, for example, to remove all of the layer 49 on horizontal surfaces and leave the vertically orientated segments like sidewall segments 27 shown in dotted lines in FIG. 10 adhered to the sides of gates 34 and 35. Photoresist is applied, masked and exposed in a region above one of the sidewall segments 27 and developed. The underlying sidewall 27 located in FIG. 11 on the left hand side is selectively etched away. A thermal oxide 51 is then grown on the exposed silicon and polysilicon surfaces to a thickness of about 375 A to prevent outdiffusing of subsequently implanted phosphorus as well as implant damage on the silicon surface.

Figure 12:
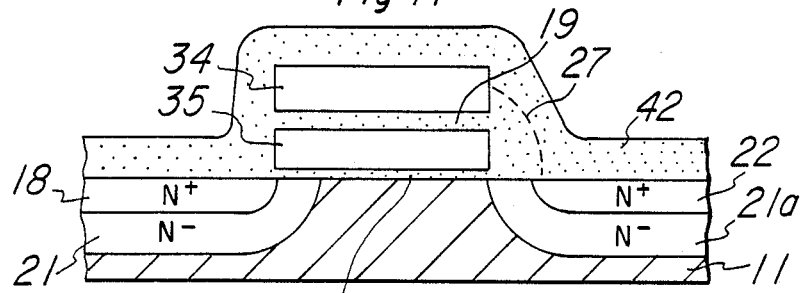

An arsenic implant is now performed to create the N+ source/drain regions 18 and 22 of FIG. 12, using the polysilicon 34 and 35 and remaining sidewall segment 27 as a self-align mask. Then a phosphorus implant to a dosage of about $8 \times 10^{13}$ to $2 \times 10^{14}$ per $cm^3$ is performed. A high temperature of 950° to 1000° C. anneals implant damage and causes lateral diffusion to create the "reach-through" N− region 21, the $N^{31}$ region 21a as well as N+ region 18 and 20. Regions 21 and 21a are formed due to faster diffusion of phosphorus than arsenic through the silicon.

A thick layer of silicon oxide 42 is deposited over the entire slice by decomposition of silane at a low temperature, about 400° C. This layer insulates the metal layer from the layer of polycrystalline silicon and other areas of the face of the bar, and is referred to as a multilevel oxide.

The multilevel oxide layer 49 is now patterned by a photoresist operation which exposes holes for what will be metal to poly or metal to silicon contacts. Metal contacts and interconnections are made in the usual manner by depositing a thin film of aluminum over the entire top surface of the slice then patterning it by a photoresist mask and etch sequence, leaving the metal contacts or strips and other metal elements. A protective coat is then deposited and patterned to expose the bonding pads (not shown) and the slice is scribed and broken into individual bars which are packaged in the customary manner.

The concept of the invention is also applicable to the p-channel transistors in CMOS devices, using boron for both the heavily doped source 18 and drain 20 and the lightly doped P "reach-through" region 21. First a light-dosage boron implant is performed at the stage of FIG. 11, and a high temperature drive-in to diffuse the boron laterally beneath sidewall segment 27, then subsequently, a heavy-dosage boron implant, with no lengthy high-temperature exposure following it, produces the P+ source 18 and drain 20 regions.

Figure 13:
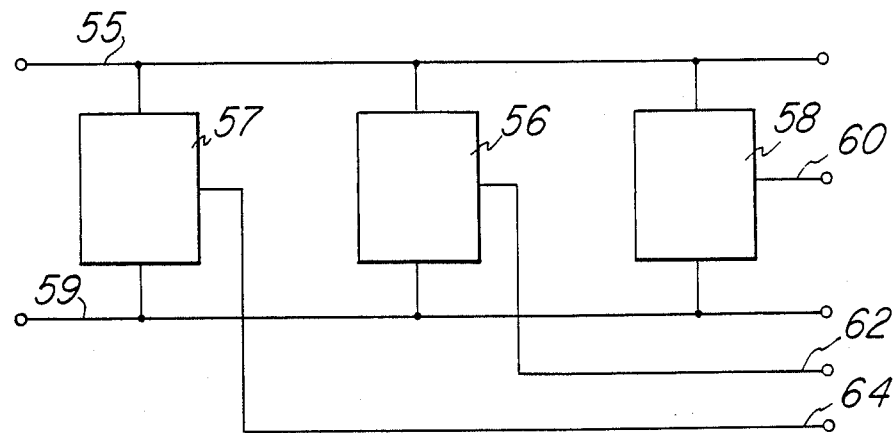
FIG. 13 is a block diagram of the electrical circuit for providing the various voltage levels required by each cell.
Figure 14:
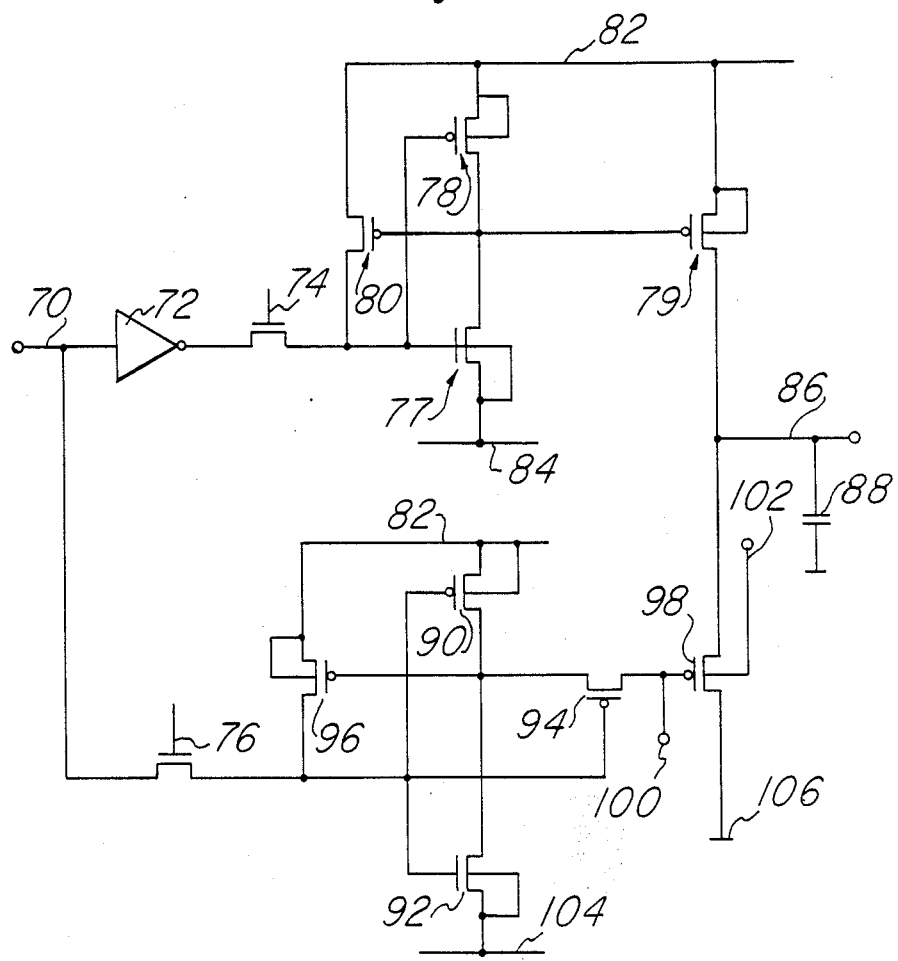
FIG. 14 is a schematic diagram of a circuit for driving each word line of an array.

The circuitry required to drive the cells is indicated by FIGS. 13 and 14. FIG. 13 shows in block diagram form the circuit required to produce the bipolar voltage levels required while FIG. 14 shows a switching circuit required to drive each line with a voltage required for a particular mode of operation.

In FIG. 13 a single voltage source of say 5 volts is used as input along line 55 with line 59 being ground or substrate voltage. Three charge pumps 57, 56 and 58 the design of which are well known in the art are coupled in parallel across lines 55 and 59. Each charge pump 57, 56 and 58 produces output voltages −Vgg, −−Vpp and +Vpp associated output lines 64, 62 and 60, respectively.

The circuit of FIG. 14 functions in response to input control signals received on input line 70 which are fed in parallel to an inverter 72 and through the source to drain path of a field effect transistor 76 whose gate is at Vdd or +5 volts. The inverter 72 output also passes through an field effect transistor 74 whose gate is at Vdd or +5 V. The output from transistor 74 couples in parallel to gates of n-channel transistor 77 and p-channel field effect transistors 78 and to drain of p-channel transistor 80 to which the source of transistor 80 connects to Vpp line 82 and its gate connects to the drain of transistor 77. The source of transistor 77 connects to ground or Vss line 84 while that of transistor 78 connects to Vpp line 82.

The output from transistor 76 couples to the gates of transistors 90, 92 and 94 with transistors 90 and 94 being of the p-channel type. The drains of transistors 90 and 92 couple to a gate of transistor 96 and to a source of transistor 94. The drain of transistor 94 couples both to Vgg line 100 and to a gate of p-channel field effect transistor 98. Transistor 96 has a source connected to Vpp line 82 and a drain connected an output of transistor 76. The source of transistor 90 connects to Vpp line 82 while that of transistor 92 connects to Vss line 104.

Output transistor 79 has a source connected to Vpp line 82 and a drain connected to output line 86 while its complementary driver p-channel transistor 98 has a drain connected to −Vpp line 106 and a source connected to output line 86. Line 86 is charged and discharged by output capacitor 88 connected to Vss.

In operation a 0 voltage input on input line 70 results in a positive signal at the output of inverter 72 which is applied to the gates of transistors 77 and 78. In response transistor 77 turns on grounding the gates of transistors 79 and 80 and turning on both of the latter. Thus, transistor 79 in turning on connects Vpp line 82 to output line 86. The charge pump 58 is operative to charge capacitor 88 to +Vpp. Simultaneously, transistor 80 couples Vpp line 82 to the gates of transistors 77 and 78 thereby maintaining transistor 77 in an ON state and ensuring that there is no net voltage across the source-gate of transistor 78 so that the latter is cut off. Transistor 74 blocks the transmission of Vpp to the output of inverter 72. Thus, capacitor 88 is charged through the channel resistance transistor 79 to Vpp.

A zero output applied through transistor 76 turns on transistors 90 and 94 coupling +Vpp on line 82 to the gate of transistor 98 and maintaining the latter OFF.

With an input signal at 1, inverter 72 applies a 0 signal to gates of transistors 77 and 78 turning on transistor 78 and applying Vpp on line 82 to the gate of transistor 79. Transistor 79 is thus turned and/or maintained OFF.

An input signal at 1 turns on transistor 92 which applies 0 volts to the source of transistor 94 and maintains the latter off. The −Vgg and −Vpp charge pumps 57 and 56 are then activated and transistor 98 turns on charging line 86 towards −Vpp. At the same time the Vpp line 82 is tied to Vdd line 55.

Clearly, a variety of different voltages could be produced by the circuit of FIG. 13 depending upon the requirements. For the cells of FIG. 1 the combination +14 v, −7 v and 2.0 v, 0 v, and −2 v would be appropriate for the row line, and 7 v and 0 v for the bit or read line.

While this invention has been described with reference to an illustrative embodiment, this description is not intended to be construed in a limiting sense. Various modifications of the illustrative embodiment, as well as other embodiments of the invention will be obvious to those skilled in the art upon reference to this description. It is, therefore, contemplated that the appended claims will cover any such modification or embodiments as fall within the true scope of the invention.

What is claimed

1. A method of making an electrically erasable programmable memory cell having a floating gate with a heavily doped source/drain region laterally spaced therefrom on one side thereof and having a source/drain region with a lightly doped reach-through region on the other side thereof, comprising:

(a) applying a floating gate layer to a face of a semiconductor body insulated from the face by a gate insulator;
(b) introducing a first impurity of one conductivity type onto said face on either side of said floating gate but spaced from an edge of said floating gate on one side thereof by a gap to create a heavily doped source/drain region;
(c) implanting a second impurity of said one-conductivity type into said face on either side of said floating gate but spaced from an edge of said floating gate on one side thereof by a gap;
(d) diffusing the first and second impurities to create a lightly-doped reach-through region extending to the face of the semiconductor underneath the floating gate on said other side thereof; and
(e) applying a control gate layer to a face of the semiconductor body insulated from the floating gate by a layer of interlevel oxide.

2. A method according to claim 1, wherein the semiconductor body is P type silicon, the source and drain regions are N+ type and the reach-through region is N− type.

3. A method of making an electrically erasable, programmable memory cell having a floating gate with a heavily doped source/drain region laterally spaced therefrom on one side thereof and having a source/drain region with a lightly doped reach-through region on the other side thereof, comprising:
(a) applying a floating gate layer to a face of a semiconductor body insulated from the face by a gate insulator;
(b) forming a gate oxide layer on said face extending over a top and sidewall of said gate layer;
(c) selectively removing the oxide layer from the top of said gate, substantially all of one sidewall thereof and the oxide layer from the face, leaving a sidewall segment of oxide on one side of said gate;
(d) introducing a first impurity of one conductivity type into said face using the gate layer and sidewall segment as masks to create a heavily-doped source/drain regions, one of said regions being laterally spaced on the side having the sidewall segment by a gap;
(e) implanting a second impurity of said one-conductivity type having a much higher diffusion coefficient than that of the first impurity into said face using said gate layer and sidewall segment as masks and laterally diffusing the second impurity ahead of the first impurity to create a lightly-doped reach-through region extending to the face of the semiconductor beneath the floating gate;
(f) forming an interlevel oxide layer over the floating gate and face of the semiconductor; and
(g) depositing a control gate layer over said interlevel oxide registering with said floating gate and extending therebeyond to form a row line.

4. A method according to claim 3, wherein the first impurity is arsenic and the second impurity is phosphorous.

5. A method according to claim 4, wherein the semiconductor body is P-type silicon.

6. A method according to claim 3, including forming positive and negative voltage generators for operating said memory cell.

7. A method according to claim 3, wherein the gate oxide is about 100 Å thick.

8. A method according to claim 7, wherein the area of the channel over which is superimposed floating gate is about 1.875 square micrometers.

9. A method according to claim 8, wherein the width of said reach through region overlaid by said floating gate is about ¼ micrometer.

10. A method according to claim 9, wherein the thickness of interlevel oxide is about 375 Å.

* * * * *